(12) United States Patent
Miao et al.

(10) Patent No.: US 12,070,773 B2
(45) Date of Patent: Aug. 27, 2024

(54) ADAPTIVE CAVITY THICKNESS CONTROL FOR MICROMACHINED ULTRASONIC TRANSDUCER DEVICES

(71) Applicant: BFLY OPERATIONS, INC., Burlington, MA (US)

(72) Inventors: Lingyun Miao, Fremont, CA (US); Jianwei Liu, Fremont, CA (US); Keith G. Fife, Palo Alto, CA (US)

(73) Assignee: BFLY OPERATIONS, INC, Burlington, MA (US)

( * ) Notice: Subject to any disclaimer, the term of this patent is extended or adjusted under 35 U.S.C. 154(b) by 28 days.

(21) Appl. No.: 18/099,456

(22) Filed: Jan. 20, 2023

(65) Prior Publication Data

US 2023/0149977 A1  May 18, 2023

Related U.S. Application Data

(62) Division of application No. 16/683,750, filed on Nov. 14, 2019, now Pat. No. 11,583,894.

(Continued)

(51) Int. Cl.
*B06B 1/02* (2006.01)
*B81B 3/00* (2006.01)
*B81C 1/00* (2006.01)

(52) U.S. Cl.
CPC .......... *B06B 1/0292* (2013.01); *B81B 3/0021* (2013.01); *B81C 1/00158* (2013.01); *B81B 2201/0271* (2013.01); *B81B 2203/0127* (2013.01); *B81B 2203/0315* (2013.01); *B81B 2203/04* (2013.01); *B81C 2201/0125* (2013.01);

(Continued)

(58) Field of Classification Search
CPC ..... B06B 1/0292; B06B 1/068; B81B 3/0021; B81B 2201/0271; B81B 2203/0127; B81B 2203/0315; B81B 2203/04; B81B 2207/053; B81C 1/00158; B81C 2201/0125; B81C 2201/013; B81C 2201/0176; B81C 2203/03; B81C 1/00182; B81C 2201/0104; B81C 2201/0178; B81C 2201/0181; B81C 99/004; B81C 2203/036
See application file for complete search history.

(56) References Cited

U.S. PATENT DOCUMENTS

| | | | | |
|---|---|---|---|---|
| 11,766,696 | B2* | 9/2023 | Miao | H10N 30/06 29/25.42 |
| 2014/0219062 | A1* | 8/2014 | Rothberg | G10K 9/12 367/135 |

(Continued)

*Primary Examiner* — Yasser A Abdelaziez
(74) *Attorney, Agent, or Firm* — Boston & Galway, LLC

(57) ABSTRACT

An ultrasonic transducer device includes a patterned film stack disposed on first regions of a substrate, the patterned film stack including a metal electrode layer and a bottom cavity layer formed on the metal electrode layer. The ultrasonic transducer device further includes a planarized insulation layer disposed on second regions of the substrate layer, a cavity formed in a membrane support layer and a CMP stop layer, the CMP stop layer including a top layer of the patterned film stack and the membrane support layer formed over the patterned film stack and the planarized insulation layer. The ultrasonic transducer device also includes a membrane bonded to the membrane support layer. The CMP stop layer underlies portions of the membrane support layer but not the cavity.

20 Claims, 7 Drawing Sheets

Related U.S. Application Data

(60) Provisional application No. 62/810,358, filed on Feb. 25, 2019.

(52) U.S. Cl.
CPC .............. *B81C 2201/013* (2013.01); *B81C 2201/0176* (2013.01); *B81C 2203/03* (2013.01)

(56) References Cited

U.S. PATENT DOCUMENTS

| | | | | |
|---|---|---|---|---|
| 2015/0368097 | A1* | 12/2015 | Behrendt | B81C 1/00626 438/510 |
| 2016/0379973 | A1* | 12/2016 | Rothberg | A61B 8/4494 438/53 |

* cited by examiner

ADAPTIVE CAVITY THICKNESS CONTROL FOR MICROMACHINED ULTRASONIC TRANSDUCER DEVICES

CROSS-REFERENCE TO RELATED APPLICATIONS

This application claims the benefit under 35 U.S.C. § 120 and is a divisional application of U.S. patent application Ser. No. 16/683,750, filed Nov. 14, 2019, which claims the benefit under 35 U.S.C. § 119(e) of U.S. Provisional Patent Application Ser. No. 62/810,358, filed Feb. 25, 2019, and entitled "ADAPTIVE CAVITY THICKNESS CONTROL FOR MICROMACHINED ULTRASONIC TRANSDUCER DEVICE," which are hereby incorporated herein by reference in their entirety.

BACKGROUND

The present disclosure relates generally to micromachined ultrasonic transducers and, more specifically, to adaptive thickness control for micromachined ultrasonic transducer cavities and transducer manufacturing techniques.

Ultrasound devices may be used to perform diagnostic imaging and/or treatment, using sound waves with frequencies that are higher than those audible to humans. When pulses of ultrasound are transmitted into tissue, sound waves are reflected off the tissue with different tissues reflecting varying degrees of sound. These reflected sound waves may then be recorded and displayed as an ultrasound image to the operator. The strength (amplitude) of the sound signal and the time it takes for the wave to travel through the body provide information used to produce the ultrasound images.

Some ultrasound imaging devices may be fabricated using micromachined ultrasonic transducers, including a flexible membrane suspended above a substrate. A cavity is located between part of the substrate and the membrane, such that the combination of the substrate, cavity and membrane form a variable capacitor. When actuated by an appropriate electrical signal, the membrane generates an ultrasound signal by vibration. In response to receiving an ultrasound signal, the membrane is caused to vibrate and, as a result, generates an output electrical signal.

SUMMARY

In one aspect, an adaptive cavity thickness control for micromachined ultrasonic transducer cavities is disclosed. A method of forming an ultrasonic transducer device includes forming and patterning a film stack over a substrate, the film stack comprising a metal electrode layer and a chemical mechanical polishing (CMP) stop layer formed over the metal electrode layer; forming an insulation layer over the patterned film stack; planarizing the insulation layer to the CMP stop layer; measuring a remaining thickness of the CMP stop layer; and forming a membrane support layer over the patterned film stack, wherein the membrane support layer is formed at thickness dependent upon the measured remaining thickness of the CMP stop layer, such that a combined thickness of the CMP stop layer and the membrane support layer corresponds to a desired transducer cavity depth.

In another aspect, a method of forming ultrasonic transducer devices includes forming and patterning a film stack over a first wafer, the film stack comprising a metal electrode layer and a chemical mechanical polishing (CMP) stop layer formed over the metal electrode layer; forming an insulation layer over the patterned film stack; planarizing the insulation layer to the CMP stop layer; measuring a remaining thickness of the CMP stop layer; forming a membrane support layer over the patterned film stack, wherein the membrane support layer is formed at thickness dependent upon the measured remaining thickness of the CMP stop layer, such that a combined thickness of the CMP stop layer and the membrane support layer corresponds to a desired transducer cavity depth; and using the measured remaining thickness of the CMP stop layer from the first wafer as CMP parameter for forming subsequent transducer devices on one or more additional wafers.

In another aspect, an ultrasonic transducer device includes a patterned film stack disposed on first regions of a substrate, the patterned film stack comprising a metal electrode layer and a bottom cavity layer formed on the metal electrode layer; a planarized insulation layer disposed on second regions of the substrate layer; a cavity defined in a membrane support layer and a CMP stop layer, the CMP stop layer comprising a top layer of the patterned film stack and the membrane support layer formed over the patterned film stack and the planarized insulation layer; and a membrane bonded to the membrane support layer, wherein the CMP stop layer is removed from locations corresponding to the cavity and present beneath portions of the membrane support layer.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

FIGS. 3-1 through 3-7 are a series of cross-sectional views illustrating the exemplary process flow of FIG. 2.

FIG. 4 is a flow diagram further describing an aspect of the exemplary process flow of FIG. 2.

FIG. 5 is a top view of an example ultrasonic transducer device formed using the process flow of FIG. 2, FIGS. 3-1 through 3-7, and FIG. 4.

DETAILED DESCRIPTION

The techniques described herein relate to adaptive cavity thickness control for micromachined ultrasonic transducer cavities.

One type of transducer suitable for use in ultrasound imaging devices is a micromachined ultrasonic transducer (MUT), which can be fabricated from, for example, silicon and configured to transmit and receive ultrasound energy. MUTs may include capacitive micromachined ultrasonic transducers (CMUTs) and piezoelectric micromachined ultrasonic transducers (PMUTs), both of which can offer several advantages over more conventional transducer designs such as, for example, lower manufacturing costs and fabrication times and/or increased frequency bandwidth. With respect to the CMUT device, the basic structure is a parallel plate capacitor with a rigid bottom electrode and a top electrode residing on or within a flexible membrane. Thus, a cavity is defined between the bottom and top electrodes. In some designs (such as those produced by the assignee of the present application for example), a CMUT may be directly integrated on an integrated circuit that controls the operation of the transducer. One way of manufacturing a CMUT is to bond a membrane substrate to an integrated circuit substrate, such as a complementary metal oxide semiconductor (CMOS) substrate. This may be performed at temperatures sufficiently low to prevent damage to the devices of the integrated circuit.

Figure 1:
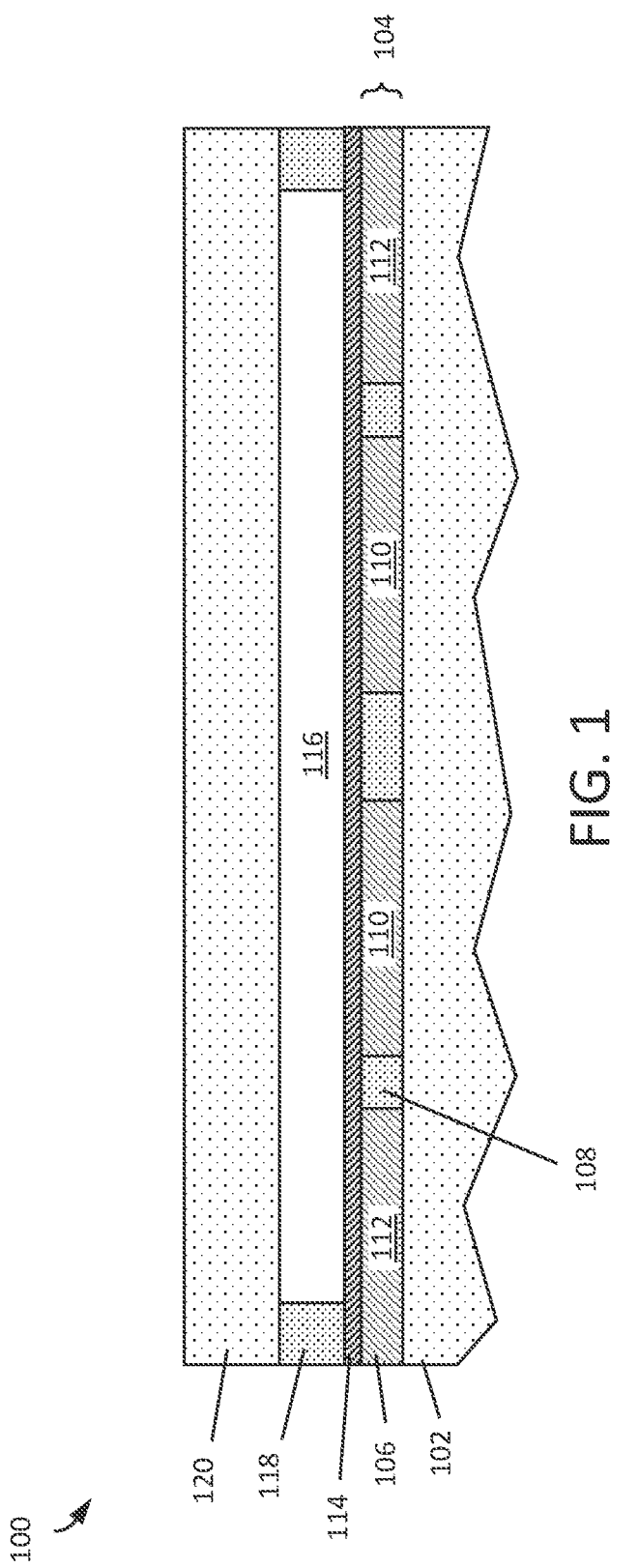
FIG. 1 is a cross-sectional view of an exemplary micromachined ultrasonic transducer device.

Referring initially now to FIG. 1, there is shown a cross-sectional view of an exemplary micromachined ultrasonic transducer device 100, such as a CMUT. The transducer device 100 includes a substrate, generally designated by 102, (e.g., a complementary metal oxide semiconductor (CMOS) substrate, such as silicon) having one or more layers such as for example: CMOS circuits, wiring layers, redistribution layers, and one more insulation/passivation layers. A transducer bottom electrode layer, designated generally at 104, is disposed over the substrate 102 and includes for example patterned metal regions 106 (e.g., titanium (Ti)) and insulation regions 108 (e.g., $SiO_2$). In the illustrated example, portions 110 of the metal regions 106 may serve as a transducer bottom electrode (e.g., in a "donut" or ring configuration), while portions 112 of the metal regions 106 may serve another function (e.g., a bypass metal). As specific substrate and transducer bottom electrode patterns are not the focus of the present disclosure, only a single example is presented in the figures. It will be appreciated, however, that the present embodiments may also be implemented in conjunction with several other transducer electrode structures including (but not limited to), for example: the aforementioned donut shaped electrode pattern (e.g., interior metal removed), multiple segment or ring electrodes, and additional metal patterns used for other purposes besides bottom electrodes (e.g., cavity getter during bonding).

Still referring to FIG. 1, a bottom cavity layer 114 is disposed over the transducer bottom electrode layer 104. The bottom cavity layer 114 may include, for example, a thin film layer stack including an $SiO_2$ layer deposited by chemical vapor deposition (CVD) and an aluminum oxide ($Al_2O_3$) layer deposited by atomic layer deposition (ALD). A transducer cavity 116 is defined by lithographic patterning and etching of a membrane support layer 118 that is formed on the bottom cavity layer 114. The membrane support layer 118 may be an insulating layer, such as $SiO_2$ for example, the remaining portions of which provide a support surface to which a flexible transducer membrane 120 (e.g., highly doped silicon at a concentration of about $1\times10^{18}$ atoms/cm$^3$ to about $1\times10^{19}$ atoms/cm$^3$) is bonded.

In order to preserve the integrity and functionality of the various CMOS devices residing within the substrate 102, a relatively low temperature bonding process (e.g., less than about 450° C.) is employed for bonding the transducer membrane 120 to the membrane support layer 118. Accordingly, it is desirable to have a smooth bonding interface between the bonded surfaces. In one example, a surface roughness less than about 1 nanometers (nm) over a range of 100 microns (μm) may be desirable for this purpose. Thus, chemical mechanical polishing (CMP) may be used during the manufacturing process to planarize the metal regions 106 and insulation regions 108 of the transducer bottom electrode layer 104 to provide a smooth bonding interface for downstream steps.

When a metal electrode layer is formed over a CMOS substrate, such as substrate 102 of FIG. 1, it may be lithographically patterned and etched to form, for example, the pattern illustrated in FIG. 1 (e.g., patterned portions 110 and 112). The insulation regions 108 may then be formed by blanket deposition and overfill of insulation material (e.g., $SiO_2$) followed by CMP removal to expose and planarize the metal patterned portions 110/112. One way to facilitate this part of the manufacturing process may be to form a CMP stop layer (not shown) atop the metal of the bottom electrode metal layer 104 prior to electrode patterning. Following the insulation layer 108 overfill, the CMP stop layer may assist as an endpoint structure as excess oxide material is polished away.

An exemplary material that could be used to cap a Ti bottom metal electrode layer is silicon nitride (SiN). Generally speaking, SiN has a rate of removal (RR) selectivity on the order of about 10-20× that of $SiO_2$, meaning that as an $SiO_2$ layer is removed from a substrate by a process such as CMP, the same process will begin to remove $Si_3N_4$ only about 10-20 times slower than $SiO_2$. The use of SiN may therefore require it to be deposited at a greater thickness than desired and may also be somewhat disadvantageous in terms of remaining film thickness uniformity control and therefore the cavity gap control. Moreover, since SiN is an insulating material instead of a conductive material, and since it can also act as a charge trapping material that may be detrimental to the operation of a CMUT device, it is a sacrificial dielectric CMP stop layer in that it needs to be removed after polishing. This in turn results in a longer process cycle time and possibly even poorer surface roughness due to this extra removal process. On the other hand, without the use of a sacrificial CMP stop layer such as SiN (e.g., forming the Ti electrode metal alone but at a greater initial thickness and using the Ti material itself as a CMP stop layer for removing $SiO_2$), removal selectivity and surface roughness would be even worse. Moreover, the process would be uncontrollable.

Accordingly, the inventors herein have recognized that it is desirable to incorporate a fabrication scheme that can be used to produce CMUT devices with good control of the cavity thickness and bonding surface roughness. A decreased cavity thickness variation will positively impact CMUT acoustic performance while a decreased bonding surface roughness will positively impact CMUT cavity formation quality and yield, which is in turn highly advantageous for volume manufacturing of integrated, on-chip ultrasound transducer devices such as discussed above. As will be described in further detail below, exemplary embodiments of adaptive cavity thickness control methods are designed to address volume manufacturing requirements through, among other aspects, "feed forward" and "feed backward" control mechanisms.

Referring generally now to FIG. 2 and FIGS. 3-1 through 3-7 there is shown, respectively, a flow diagram and a series of cross-sectional views illustrating an exemplary process 200 for forming a micromachined ultrasonic transducer device having adaptive cavity thickness control according to an embodiment. For ease of illustration, like elements in the various figures are designated with like reference numerals where applicable. As indicated in block 202 of FIG. 2 and shown in FIG. 3-1, a multilayer stack 302 is deposited on a CMOS substrate 102. In an exemplary embodiment, the multilayer stack 302 may include a bottom electrode metal layer 104 (e.g., a Ti layer 106 having a thickness of about 100 nm to about 300 nm formed on the CMOS substrate 102), a bottom cavity layer 114 formed on the bottom electrode metal layer 114 (e.g., a thin film layer stack including a CVD $SiO_2$ layer having a thickness of about 10 nm to about 30 nm, and an ALD $Al_2O_3$ layer having a thickness of about 20 nm to about 40 nm), and a dielectric CMP stop layer 304 (e.g., SiN having an initial thickness, do, of about 10 nm to about 30 nm) formed on electrode metal layer 114.

Figure 2:
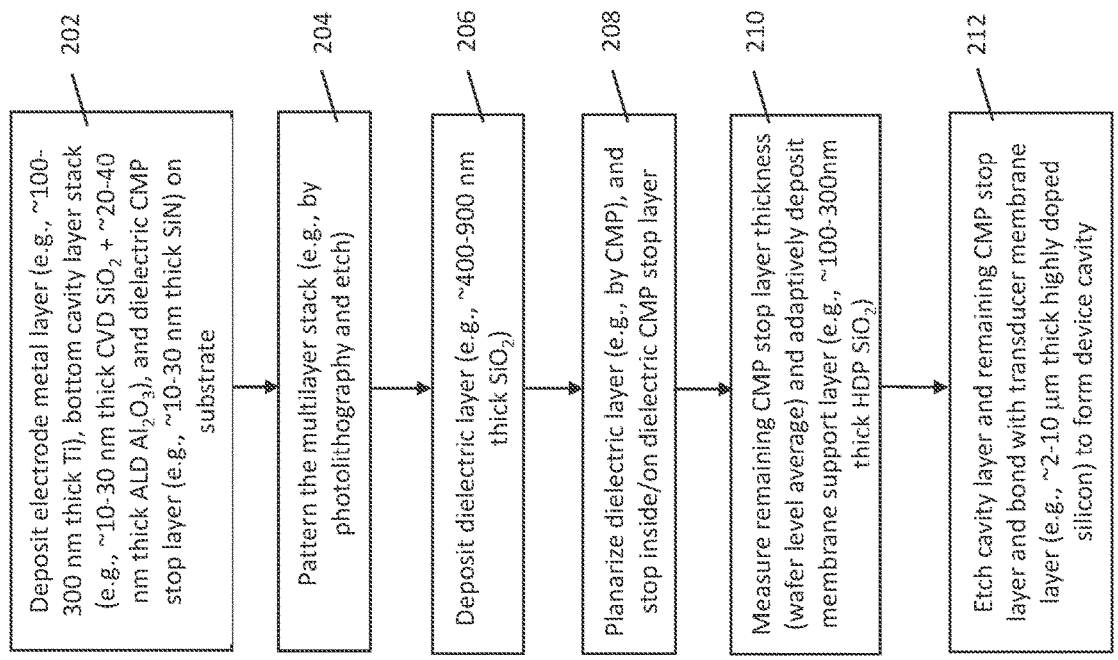
FIG. 2 is a flow diagram describing an exemplary process flow for forming a micromachined ultrasonic transducer device having adaptive cavity thickness control according to an embodiment.
Figures 1, 3:
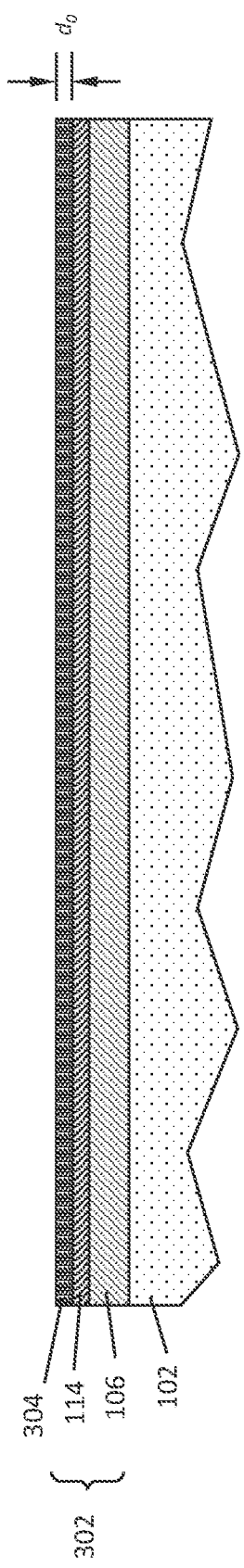
Figures 2, 3:
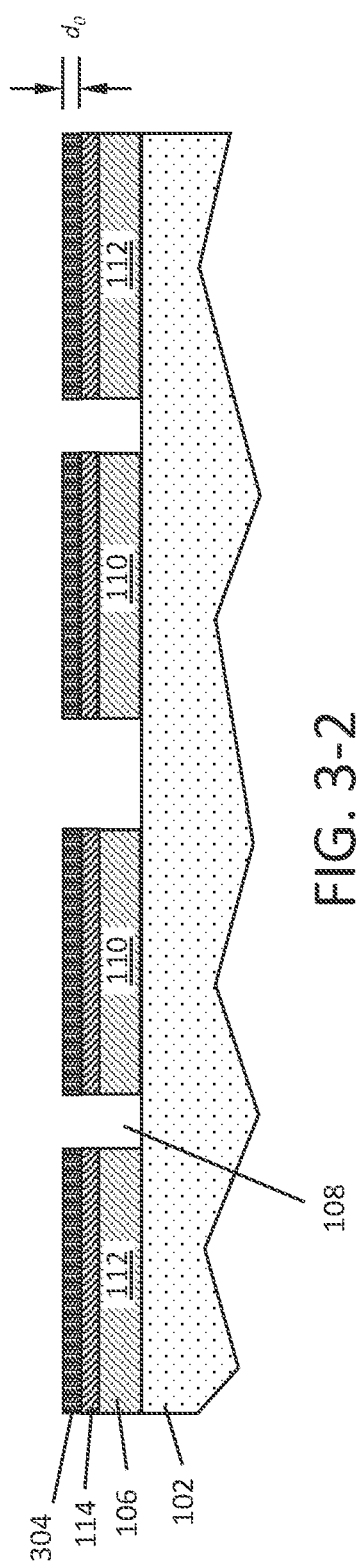
Figure 3:
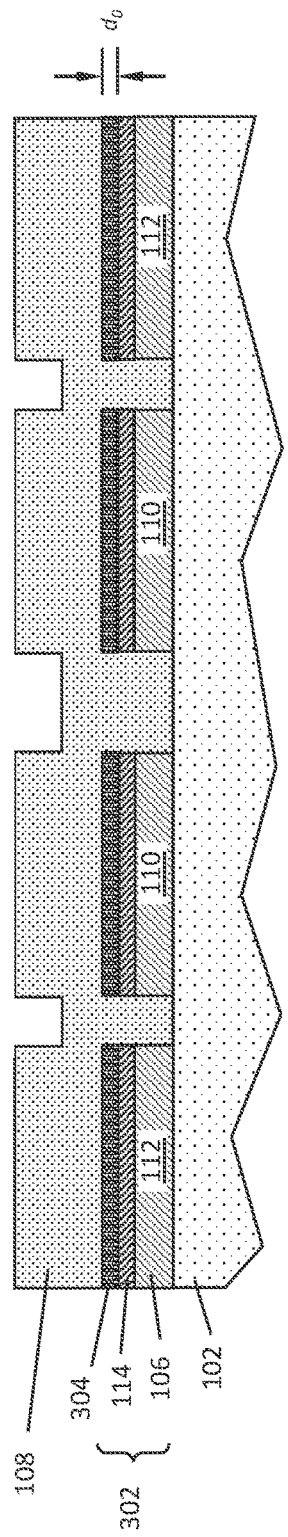

Then, as indicated in block 204 of FIG. 2, the multilayer stack 302 is patterned, e.g., by photolithography and etching, to form the pattern shown in FIG. 3-2. Again, because specific transducer bottom electrode patterns are not the focus of the present disclosure, it will be appreciated that other patterns could be used in accordance with embodiments. As indicated previously, portions 110 of the patterned multilayer stack 302 may correspond to a transducer bottom electrode (e.g., in a "donut" or ring configuration), while portions 112 of the multilayer stack 302 may serve another function (e.g., a bypass metal).

From this point, the process 200 proceeds to block 206 of FIG. 2 where a dielectric material (e.g., $SiO_2$ layer) is formed over the structure so as to fill the regions corresponding to removed multilayer stack 302 material. In an embodiment, the $SiO_2$ layer 108 may be initially formed at thickness of about 400 nm to about 900 nm and may generally conform to the topography as the underlying patterned multilayer stack 302, as illustrated in FIG. 3-3. Then, as indicated in block 208 of FIG. 2 and illustrated in FIG. 3-4, the $SiO_2$ layer 108 is planarized by CMP, stopping on or within the CMP stop layer 304. Following CMP, the resulting thickness of the CMP stop layer 304 is indicated by the dimension $d_1$ in FIG. 3-4. Assuming at least some material of the CMP stop layer 304 is removed during the planarization process, the post CMP thickness, $d_1$, of CMP stop layer 304 should be less than the initial thickness, do.

Figures 3, 4:
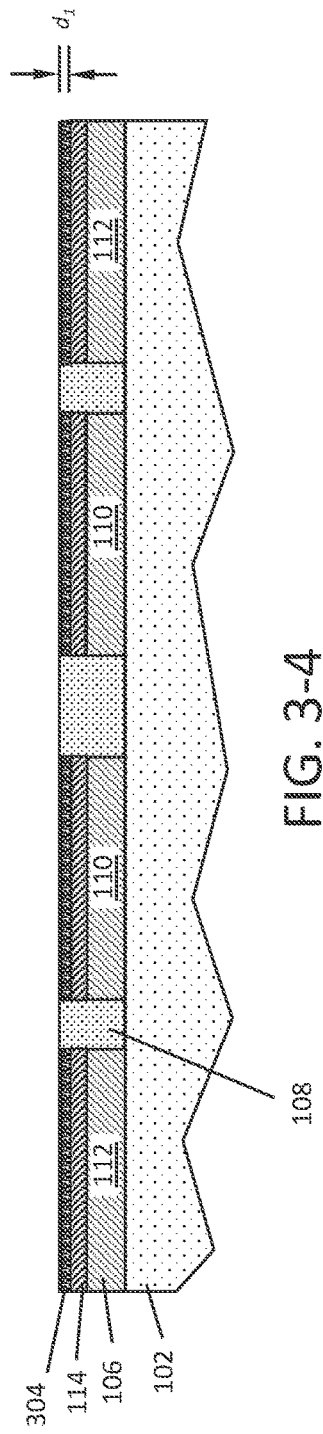
Figures 3, 4, 5:
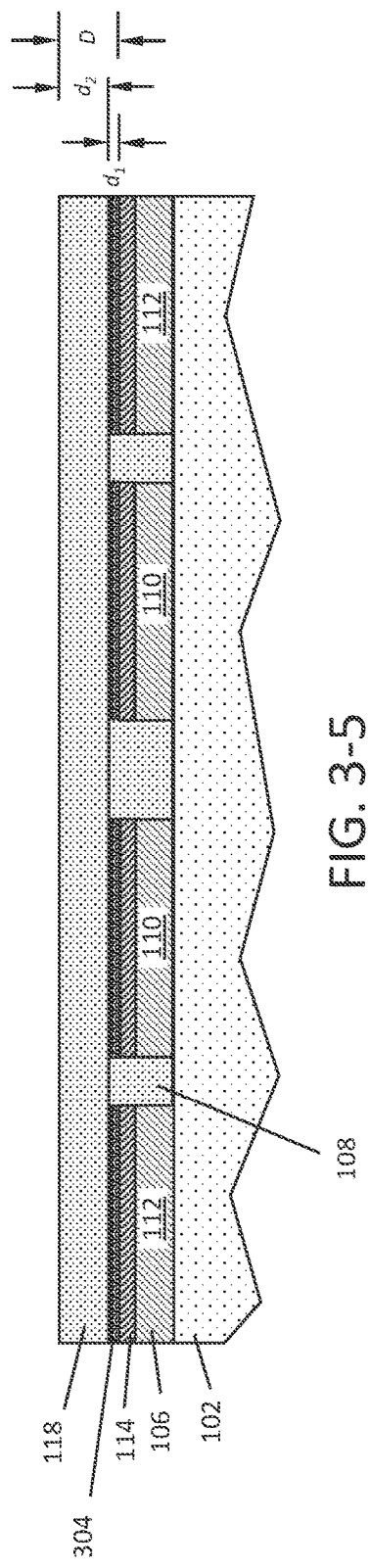
Figures 3, 4, 5, 6:
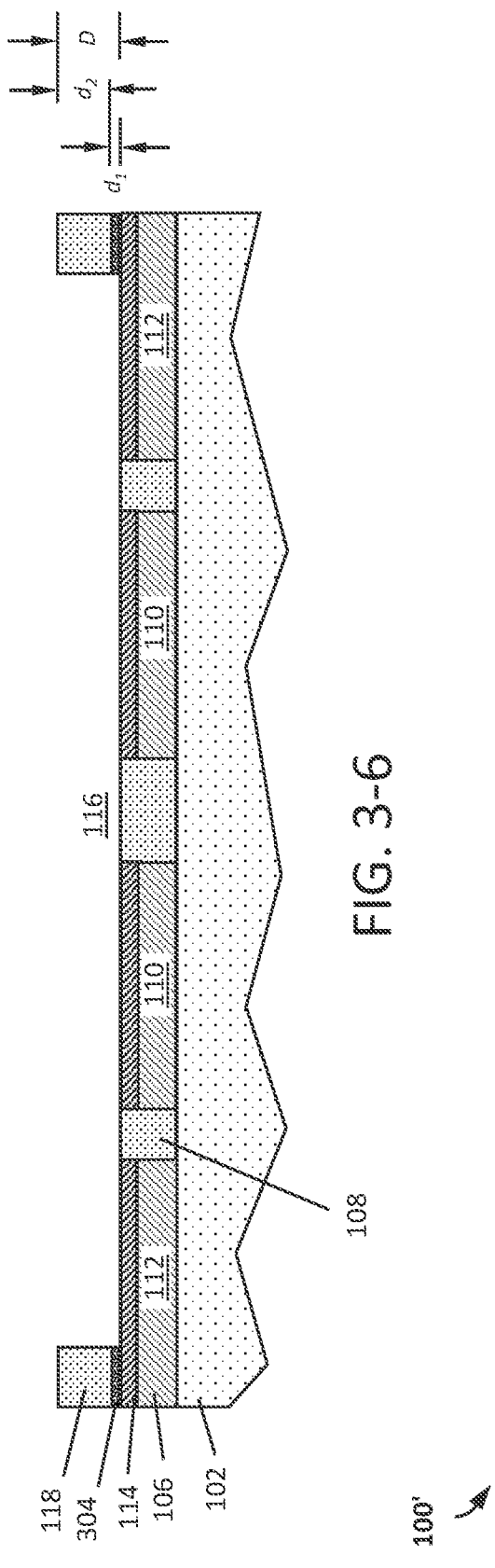
Figures 3, 4, 5, 6, 7:
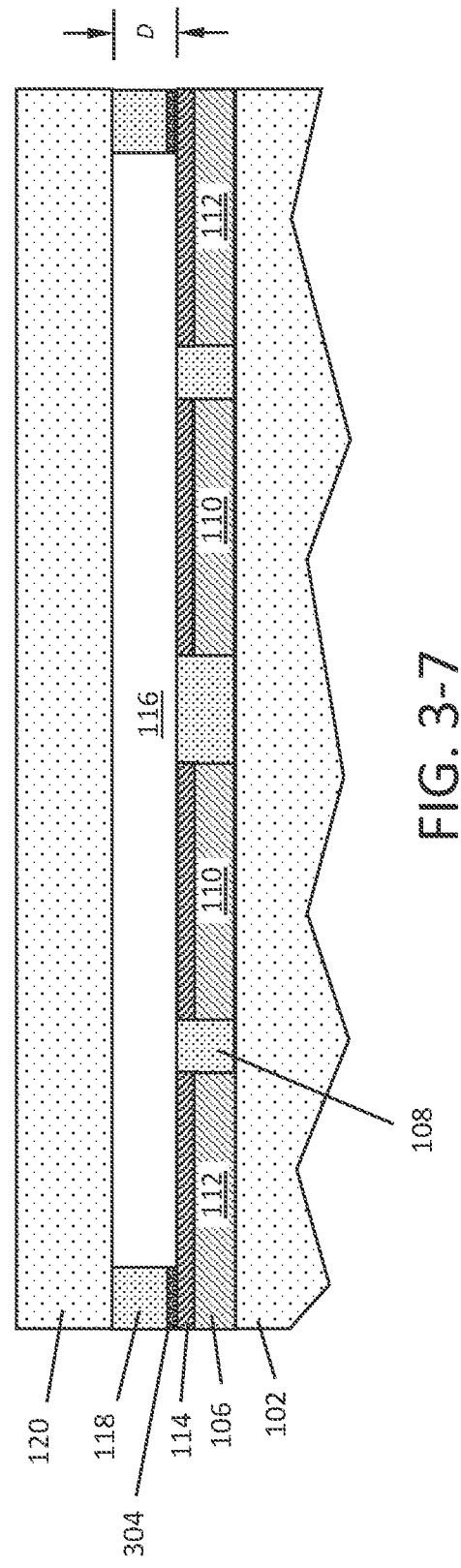
Figure 4:
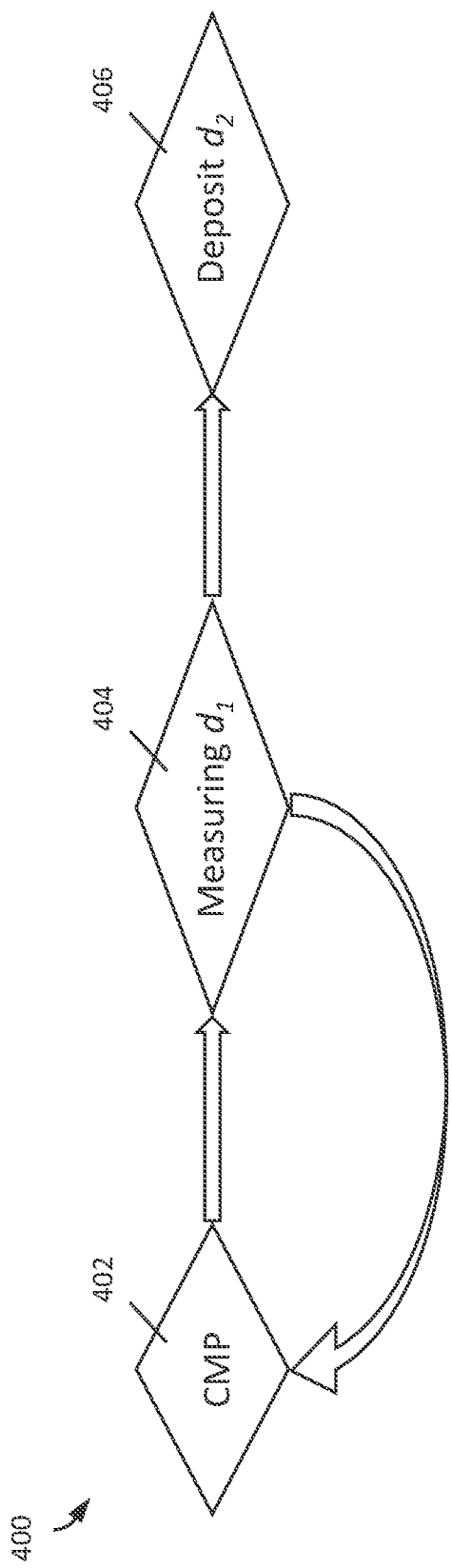
Figure 5:
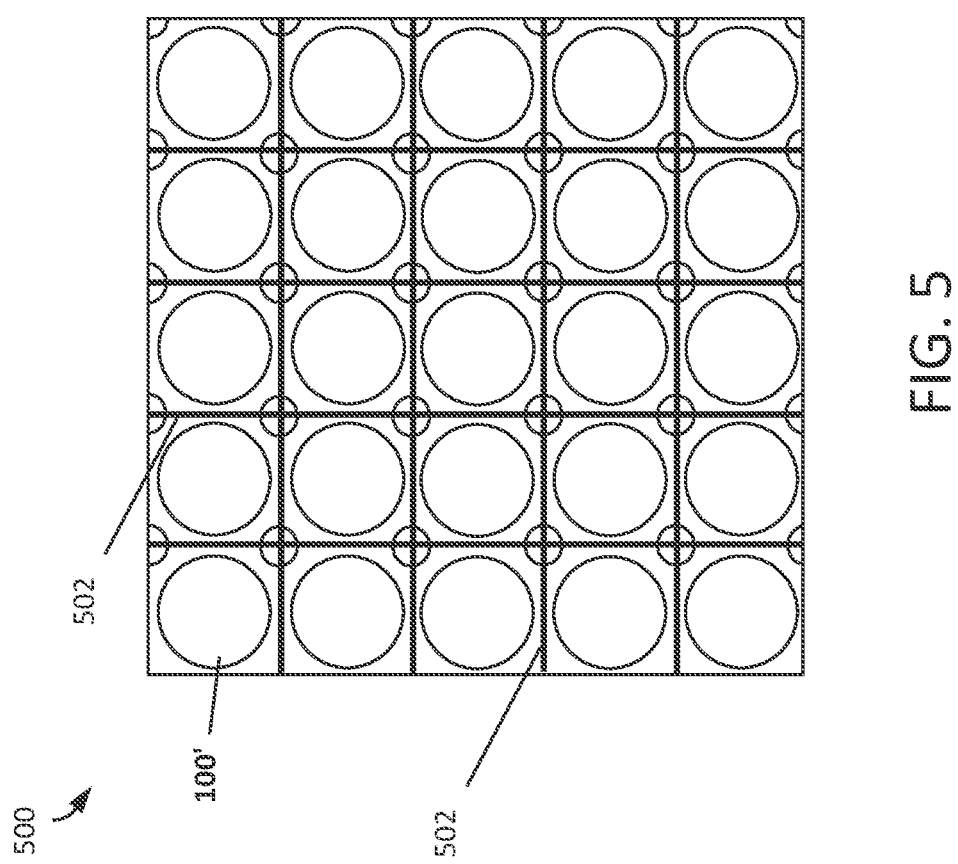

A post-CMP metrology operation is then performed as indicated in block 210 of FIG. 2 in order to measure the post CMP thickness, $d_1$, of CMP stop layer 304, followed by adaptively depositing a membrane support layer 118 (e.g., HDP $SiO_2$) on the planarized structure of FIG. 3-4, as illustrated in FIG. 3-5. In an embodiment, the thickness measurement of $d_1$ may be performed using thin film measurement techniques and tools such as an ellipsometer or by spectroscopic reflectometry. Multiple measurements may also be made at different locations on a same die and/or wafer in order to obtain an average thickness for $d_1$. Because the transducer cavity height corresponds to the post CMP thickness ($d_1$) of the CMP stop layer 304 plus the thickness of the membrane support layer 118 (designated by $d_2$ in FIG. 3-5), the measurement of $d_1$ adaptively determines the depth $d_2$ at which the membrane support layer 118 should be deposited in order to achieve a desired target cavity depth, D, such that $D=d_1+d_2$. Depending on the measured thickness $d_1$ of CMP stop layer 304, it is contemplated that the membrane support layer 118 may be formed at a thickness of about 100 nm to about 300 nm on the bottom cavity layer 114.

Proceeding to block 212 of FIG. 2, a micromachined ultrasonic transducer 100' is defined by etching both the membrane support layer 118 and the CMP stop layer 304 to define a cavity 116 as shown in FIG. 3-6, followed by bonding a membrane layer 120 (e.g., highly doped silicon) having an exemplary thickness of about 2 μm to about 10 μm to the membrane support layer 118 to seal the cavity 116 as shown in FIG. 3-8. It should further be appreciated at this point that although the illustrated embodiments depict a single cavity, any suitable number of cavities and corresponding electrode structures may be formed (e.g., hundreds, thousands, tens of thousands, etc.) such that the CMOS substrate 102 may form part of a first semiconductor wafer and the membrane layer 120 may form part of a second semiconductor wafer bonded to the first semiconductor wafer so as to seal a number of such transducer cavities 116 (e.g., hundreds, thousands, tens of thousands, etc.).

FIG. 4 is a flow diagram 400 further describing an aspect of the exemplary process flow of FIG. 2. As indicated above, the disclosed adaptive cavity thickness control scheme is designed to have both "feed forward" and "feed backward" control mechanisms. For example, following CMP (block 402) the process scheme incorporates a post-CMP metrology step (measuring $d_1$, block 404) and can achieve good cavity thickness control as well as bonding surface roughness control. In one aspect, measuring the CMP stop layer thickness $d_1$ serves as a feed forward control mechanisms, in that the measured CMP stop layer remaining thickness $d_1$ is forwarded to a downstream process (block 406) to determine the adaptive deposition thickness $d_2$, where $d_2=D-d_1$. In another aspect, the same measured CMP stop layer thickness $d_1$ serves may also be feedback to the CMP process (block) to monitor the CMP removal rate, and thus a timely process control parameter for the next incoming wafer. Such control mechanisms may be particularly advantageous in volume manufacturing environment.

FIG. 5 illustrates a top view of an example ultrasonic transducer device 500 formed using the exemplary process flow embodiments described herein. As illustrated, the transducer device includes an array of individual transducers 100', such as those described above. The specific number of transducers 100' shown in FIG. 5 should not be construed in any limiting sense, and may include any number suitable for a desired imaging application, which may be for example on the order of tens, hundreds, thousands, tens of thousands or more. FIG. 4 further illustrates an example location of metal 502 that may distribute an electrical signal to the membranes (upper electrodes) of the transducers 100'. It should also be appreciated that although the exemplary geometric structure of this portion of the ultrasonic transducer 100' is generally circular in shape, other configurations are also contemplated such as for example, rectangular, hexagonal, octagonal, and other multi-sides shapes, etc.

The above-described embodiments can be implemented in any of numerous ways. For example, the embodiments may be implemented using hardware, software or a combination thereof. When implemented in software, the software code can be executed on any suitable processor (e.g., a microprocessor) or collection of processors, whether provided in a single computing device or distributed among multiple computing devices. It should be appreciated that any component or collection of components that perform the functions described above can be generically considered as one or more controllers that control the above-discussed functions. The one or more controllers can be implemented in numerous ways, such as with dedicated hardware, or with general purpose hardware (e.g., one or more processors) that is programmed using microcode or software to perform the functions recited above.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, some aspects of the technology may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. An ultrasonic transducer device, comprising:
    a patterned film stack disposed on first regions of a substrate, the patterned film stack comprising a metal electrode layer and a bottom cavity layer formed on the metal electrode layer;
    a planarized insulation layer disposed on second regions of the substrate layer;
    a cavity formed in a membrane support layer and a CMP stop layer, the CMP stop layer comprising a top layer of the patterned film stack and the membrane support layer formed over the patterned film stack and the planarized insulation layer; and
    a membrane bonded to the membrane support layer, wherein the CMP stop layer underlies portions of the membrane support layer but not the cavity.

2. The ultrasonic transducer device of claim 1, wherein the CMP stop layer comprises a dielectric material.

3. The ultrasonic transducer device of claim 2, wherein the CMP stop layer comprises SiN.

4. The ultrasonic transducer device of claim 1, wherein the metal electrode layer comprises titanium (Ti).

5. The ultrasonic transducer device of claim 4, wherein the metal electrode layer has a thickness of about 100 nm to about 300 nm.

6. The ultrasonic transducer device of claim 1, wherein the insulation layer comprises $SiO_2$.

7. The ultrasonic transducer device of claim 1, wherein the bottom cavity layer comprises a chemical vapor deposition (CVD) $SiO_2$ layer and an atomic layer deposition (ALD) $Al_2O_3$ layer formed on the $SiO_2$ layer.

8. The ultrasonic transducer device of claim 7, wherein the CVD $SiO_2$ layer has a thickness of about 10 nm to about 30 nm and the ALD $Al_2O_3$ layer has a thickness of about 20 nm to about 40 nm.

9. The ultrasonic transducer device of claim 1, wherein the membrane support layer comprises $SiO_2$ and the membrane comprises doped silicon.

10. The ultrasonic transducer device of claim 1, wherein the membrane support layer has a thickness of about 100 nm to about 300 nm, and the membrane has a thickness of about 2 microns (μm) to about 10 μm.

11. An ultrasonic transducer device comprising:
    a substrate;
    a film stack formed over the substrate and having a metal electrode layer and a chemical mechanical polishing (CMP) stop layer formed over the metal electrode layer; and
    a membrane support layer formed over the film stack; wherein
    the membrane support layer has a thickness dependent upon a measured thickness of the CMP stop layer, such that a combined thickness of the CMP stop layer and the membrane support layer corresponds to a particular transducer cavity depth.

12. The ultrasonic transducer device of claim 11, wherein the CMP stop layer comprises a dielectric material.

13. The ultrasonic transducer device of claim 12, wherein the CMP stop layer comprises SiN.

14. The ultrasonic transducer device of claim 11, wherein the metal electrode layer comprises titanium (Ti).

15. The ultrasonic transducer device of claim 14, wherein the metal electrode layer has a thickness of about 100 nm to about 300 nm.

16. The ultrasonic transducer device of claim 11, wherein the film stack further comprises a bottom cavity layer disposed between the metal electrode layer and the CMP stop layer.

17. The ultrasonic transducer device of claim 16, wherein the bottom cavity layer comprises a chemical vapor deposition (CVD) SiO2 layer and an atomic layer deposition (ALD) $Al_2O_3$ layer formed on the SiO2 layer.

18. The ultrasonic transducer device of claim 17, wherein the CVD $SiO_2$ layer has a thickness of about 10 nm to about 30 nm and the ALD $Al_2O_3$ layer has a thickness of about 20 nm to about 40 nm.

19. The ultrasonic transducer device of claim 11, wherein the membrane support layer comprises $SiO_2$ and the membrane comprises doped silicon.

20. The ultrasonic transducer device of claim 19, wherein the membrane support layer has a thickness of about 100 nm to about 300 nm, and the membrane has a thickness of about 2 microns (μm) to about 10 μm.

* * * * *